United States Patent
Ray (10) Patent No.: US 10,484,213 B2
(45) Date of Patent: Nov. 19, 2019

(54) DC OFFSET CANCELLATION AND CROSSPOINT CONTROL CIRCUIT

(71) Applicant: Finisar Corporation, Sunnyvale, CA (US)

(72) Inventor: Sagar Ray, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 16/169,852

(22) Filed: Oct. 24, 2018

(65) Prior Publication Data

US 2019/0132163 A1 May 2, 2019

Related U.S. Application Data (60) Provisional application No. 62/579,307, filed on Oct. 31, 2017.

(51) Int. Cl.
*H04L 25/06* (2006.01)
*G01D 21/00* (2006.01)
(Continued)

(52) U.S. Cl.
CPC ........... *H04L 25/061* (2013.01); *G01D 21/00* (2013.01); *H03F 3/45475* (2013.01);
(Continued)

(58) Field of Classification Search
CPC ......... H03F 1/0272; H03F 2203/45048; H03F 2203/45512; H03F 3/45475;
(Continued)

(56) References Cited

U.S. PATENT DOCUMENTS

| 8,823,563 B1* | 9/2014 | Ransun | H03M 1/0607 |
| | | | 341/120 |
| 2005/0118980 A1 | 6/2005 | Pai et al. | |
| 2006/0091947 A1* | 5/2006 | Daio | H03F 1/34 |
| | | | 330/85 |
| 2009/0067545 A1* | 3/2009 | Chu | H03F 3/45475 |
| | | | 375/316 |

(Continued)

OTHER PUBLICATIONS

International Search Report and Written Opinion dated Jan. 21, 2019, in related PCT Application No. PCT/US2018/057868 (12 pages).

*Primary Examiner* — Khanh C Tran
(74) *Attorney, Agent, or Firm* — Maschoff Brennan (57) ABSTRACT

A circuit and method in an amplifier circuit for filtering a DC offset in differential input signals and inserting a programmable adjustable crosspoint offset in differential output signals. An amplifier circuit includes a differential amplifier circuit configured to amplify differential input signals into differential output signal. The amplifier circuit further includes a feedback circuit coupled between the differential output signals and the differential input signals. The feedback circuit is configured to generate a programmably adjustable crosspoint offset in the differential output signal and a programmably adjustable cutoff frequency of the feedback circuit. An amplifier method includes amplifying differential input signals into differential output signals, generating a programmably adjustable crosspoint offset in the differential output signal, and generating a programmably adjustable cutoff frequency of a feedback circuit between the differential output signals and the differential input signals.

18 Claims, 10 Drawing Sheets

(51) Int. Cl.
*H04L 25/03* (2006.01)
*H03F 3/45* (2006.01)
*H04B 10/69* (2013.01)

(52) U.S. Cl.
CPC ..... *H03F 3/45977* (2013.01); *H04B 10/6933* (2013.01); *H04L 25/03343* (2013.01); *H04L 25/03885* (2013.01); *H03F 2200/405* (2013.01); *H03F 2203/45134* (2013.01); *H03F 2203/45136* (2013.01); *H03F 2203/45212* (2013.01); *H03F 2203/45511* (2013.01); *H03F 2203/45521* (2013.01)

(58) Field of Classification Search
CPC . H03F 2203/45138; H03F 2203/45212; H03F 3/45618; H03F 3/45708; H03F 3/45713; H03F 3/45748; H03F 3/45977; H04B 10/6933; H04L 25/03343; H04L 25/03885; H04L 25/061; G01D 21/00; G01D 5/24

See application file for complete search history.

(56) References Cited

U.S. PATENT DOCUMENTS

| | | | |
|---|---|---|---|
| 2009/0072903 A1* | 3/2009 | Bae | H03F 3/45085 330/254 |
| 2011/0163803 A1 | 7/2011 | Guo et al. | |
| 2013/0257536 A1* | 10/2013 | Sharma | H03F 3/45475 330/259 |
| 2014/0266440 A1* | 9/2014 | Itagaki | H03F 3/45183 330/254 |
| 2015/0381287 A1 | 12/2015 | Mizobuchi et al. | |
| 2017/0366196 A1* | 12/2017 | Lovell | H04L 27/10 |

* cited by examiner

DC OFFSET CANCELLATION AND CROSSPOINT CONTROL CIRCUIT

CROSS-REFERENCE TO RELATED APPLICATION

A claim for benefit of priority to the Oct. 31, 2017 filing date of the U.S. Patent Provisional Application No. 62/579,307, titled "DC OFFSET CANCELLATION AND CROSSPOINT CONTROL CIRCUIT" (the '307 Provisional Application), is hereby made pursuant to 35 U.S.C. § 119(e). The entire disclosure of the '307 Provisional Application is hereby incorporated herein.

BACKGROUND

Field

The aspects discussed herein relate to high-speed circuits. In particular, aspects relate to circuits with differential amplifiers/drivers.

Relevant Technology

Many high speed data transmission networks rely on transceivers, including optical transceivers and similar devices, for facilitating transmission and reception of digital data embodied in the form of, for example, optical signals over optical fibers. Typically, data transmission in such networks utilize an electro-optic transducer emitting light when current is passed there through with the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

During the operation of an optical transceiver, it is often important to evaluate the quality of a received data signal. One tool often used to help in the evaluation process is an eye diagram or pattern. As is well known, an eye diagram is formed by superimposing a long stream of random bits on one another on an oscilloscope or like device. The bit streams include the transitions from high to low and low to high. Several system performance measures can be derived by analyzing the eye diagram. For example, if the signals are too long, too short, poorly synchronized with the system clock, too high, too low, too noisy, too slow to change, or have too much undershoot or overshoot, this can be observed from the eye diagram. In particular, an "open" eye diagram corresponds to minimal signal distortion.

As stated, the eye diagram may provide information of the digital data signal and the optical system such as channel noise, inter-symbol interference (ISI), performance of a transmitter, or some combination thereof within a particular signaling interval. Opening the eye generally refers to improving the eye diagram, which may occur through adjusting an offset of the input signals.

The eye diagram may also be used to observe the crosspoint. The crosspoint is the point on the eye diagram where the transitions from high to low and low to high occur. For example, a digital low is often represented by a 0 volt signal and a digital high is represented by a 1 volt signal. Accordingly, in an ideal system, the crosspoint would be observed at 0.5 volts.

One important task performed by a receiver of the transceiver is to determine if the bits of the received data signal represent a digital 0 (low) or a digital 1 (high). In order to perform such a task, circuitry in the post-amplifier reads the received data signal and makes the determination. In an ideal system with a crosspoint at 0.5 volts, any signal of 0.49 volts and below would typically be determined to be a low and any signal of 0.51 volts or higher would typically be determined to be a high. However, it is often the case that noise and other signal offsets caused by fiber impurities, transistor mismatch, and the like cause distortion in the received signals. For example, added noise may cause a signal to be incorrectly determined as a high signal. It would therefore be advantageous to have the ability to adjust the crosspoint of the received signals up or down (i.e., higher or lower than 0.5 volts) to help compensate for any signal impurities.

Another requirement might be to scan the eye diagram at different points of the XY graph to evaluate the quality of the received data quantitatively. While the scanning along the X-axis may be achieved by moving the sampling instant of the observing system, the scanning along the Y-axis requires an advertent offset to be inserted that can be achieved by crosspoint adjustment circuits.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Embodiments disclosed herein relate to an amplifier stage or circuit for providing crosspoint adjustment. In one embodiment, the circuit may include a differential amplifier configured to amplify differential input signals into differential output signals. The circuit may further include a feedback circuit coupled between the differential output signals and the differential input signals. The feedback circuit may be further configured to generate a programmably adjustable crosspoint offset in the differential output signal and a programmably adjustable cutoff frequency of the feedback circuit.

In another embodiment, an amplifier method generates a programmably adjustable crosspoint offset in differential output signals. The amplifier method may include amplifying differential input signals into differential output signals. The amplifier method may further include generating a programmably adjustable crosspoint offset in the differential output signal. The amplifier method yet further includes generating a programmably adjustable cutoff frequency of a feedback circuit between the differential output signals and the differential input signals.

In yet another embodiment, an amplifier circuit includes a differential amplifier circuit including differential inputs to couple to differential input signals and differential outputs to couple to differential output signals. The amplifier circuit further includes a feedback circuit coupled between the differential outputs and the differential inputs. The feedback circuit includes a crosspoint control circuit coupled to the differential outputs. The crosspoint control circuit includes programmably adjustable current sources to cooperatively generate a programmably adjustable crosspoint offset in the differential output signals. The feedback circuit further includes an offset frequency adjustment circuit coupled to the crosspoint control circuit. The feedback circuit yet further includes a feedback amplifier circuit coupled to the offset frequency adjustment circuit and the differential inputs.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice of the embodiments disclosed herein as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DESCRIPTION OF EMBODIMENTS

Differential amplifiers are highly prevalent in modern integrated circuit (IC) design including amplification, equalization, and filtering and amplifier/driver circuitry. In almost all the cases, any DC offset at the differential amplifier output may compromise the circuit performance and therefore, is undesirable. On the other hand, in cases where the signal itself is required to produce a certain offset to counterbalance any other external non-ideality, generation of a controlled offset at the differential amplifier output may be beneficial.

For example, certain transmission lasers may display an imbalanced duty cycle causing a crosspoint shift of the optical data eye and compensation for a pre-distorted electrical driving signal with certain offset in the opposite direction may be required. Moreover, even with the presence of an offset cancellation loop, the forward amplifier output may still display DC offset arising from mismatches in an internal feedback network that does not get corrected by the loop. Therefore, a circuit that can simultaneously cancel the unpredictable offset arising from circuit mismatches in the forward amplifier and insert a predictable offset to compensate for internal or external offset is often useful.

In one aspect, a differential circuit technique is presented that may cancel random statistical offset and at the same time insert a controlled offset, such as a programmable adjustable crosspoint offset, at the output of the differential amplifier. Specifically, a low frequency negative feedback loop senses an output DC offset and corrects the input voltage in such a way that the output DC offset diminishes.

In order to insert a controlled offset at the output, a crosspoint control circuit may be inserted in the feedback path. Due to the nature of low-frequency forward gain reduction of such offset cancellation, a forward transfer function displays a transfer function similar to a high-pass filter (HPF). The lower −3 dB cut-off frequency of this HPF may depend not only on the filter resistance and filter capacitance (RC) components in the feedback path, but also on the loop gain of the loop.

Due to process, voltage and temperature (PVT) variations, both the RC-components and the loop-gain may display severe fluctuations, resulting in similar variations in the lower-cut off frequency. Such variations may complicate a system and method to control the lower cut-off frequency. In order to control the lower cut-off frequency, the system and method disclosed herein provides a lower cut-off frequency control circuit and method.

Various aspects of the system and method described herein may further include a reduction in circuit area due to use of smaller-area resistance from active devices in place of larger-area passive resistance for generating a lower cut-off frequency of the order of several kHz in the feedback path. Further, the circuit area required for the filter capacitance for the low-pass filter in the feedback loop may be formed using capacitance multiplication techniques such as configuring a smaller capacitor, $C_m$, in a Miller configuration. The circuit area may then be further reduced based on a physically smaller capacitor providing a desired larger capacitance.

Further improvements may include a reduction in the leakage current through the filter resistance, $M_{p,r}$, since a first stage of the feedback amplifier may include MOS devices which may further result in a reduction of random statistical output offset resulting from leakage current.

Yet further, the crosspoint adjust resistances, $R_{adj}$, may be chosen to have a larger value without multiplying the effect of leakage currents. The larger value of crosspoint adjust resistances, $R_{adj}$, provides reduced power dissipation in adjustment circuitry and decouples the parasitic capacitance of the crosspoint adjust current sources, $I_{adj,1}$ and $I_{adj,2}$, to accommodate high speed operation of a forward amplifier in the feedback loop and optimize the linearity of the current mirrors utilized for the crosspoint adjust current sources, $I_{adj,1}$ and $I_{adj,2}$.

Utilization of PMOS devices for implementing filter resistance, $M_{p,r}$, allows selection of a moderate control current, $I_{f,ctl}$, and fewer biasing devices, $M_{p,sub}$, to provide sub-threshold or near cut-off operation of the PMOS devices $M_{p,r}$ for increasing (maximizing) resistance. Such an outcome results from the common mode voltage of $V_{out}$ being lower (i.e., by hundreds of millivolts) than the supply voltage.

Due to the tracking nature of the PMOS devices in the proposed configuration, $M_{p,r}$, $M_{p,sub}$ and $I_{f,ctl}$, the statistical variation of the lower cut-off frequency ($f_{-3\ dB,\ low}$) of the forward HPF transfer function may be reduced.

In spite of the variation reduction described above and illustrated below, some variation to the low pass frequency, $f_{-3\ dB}$, low, may still exist. Therefore, the low pass frequency, $f_{-3\ dB,\ low}$, may be tuned to be compatible to multiple application scenarios, for example, the offset frequency control current ($I_{f,ctl}$ in FIG. 3) may be tuned to control the lower-cut off frequency in this implementation.

Reference will now be made to figures wherein like structures will be provided with like reference designations. It is understood that the drawings are diagrammatic and schematic representations of exemplary embodiments, and are not limiting of the present invention nor are they necessarily drawn to scale.

Figure 1:
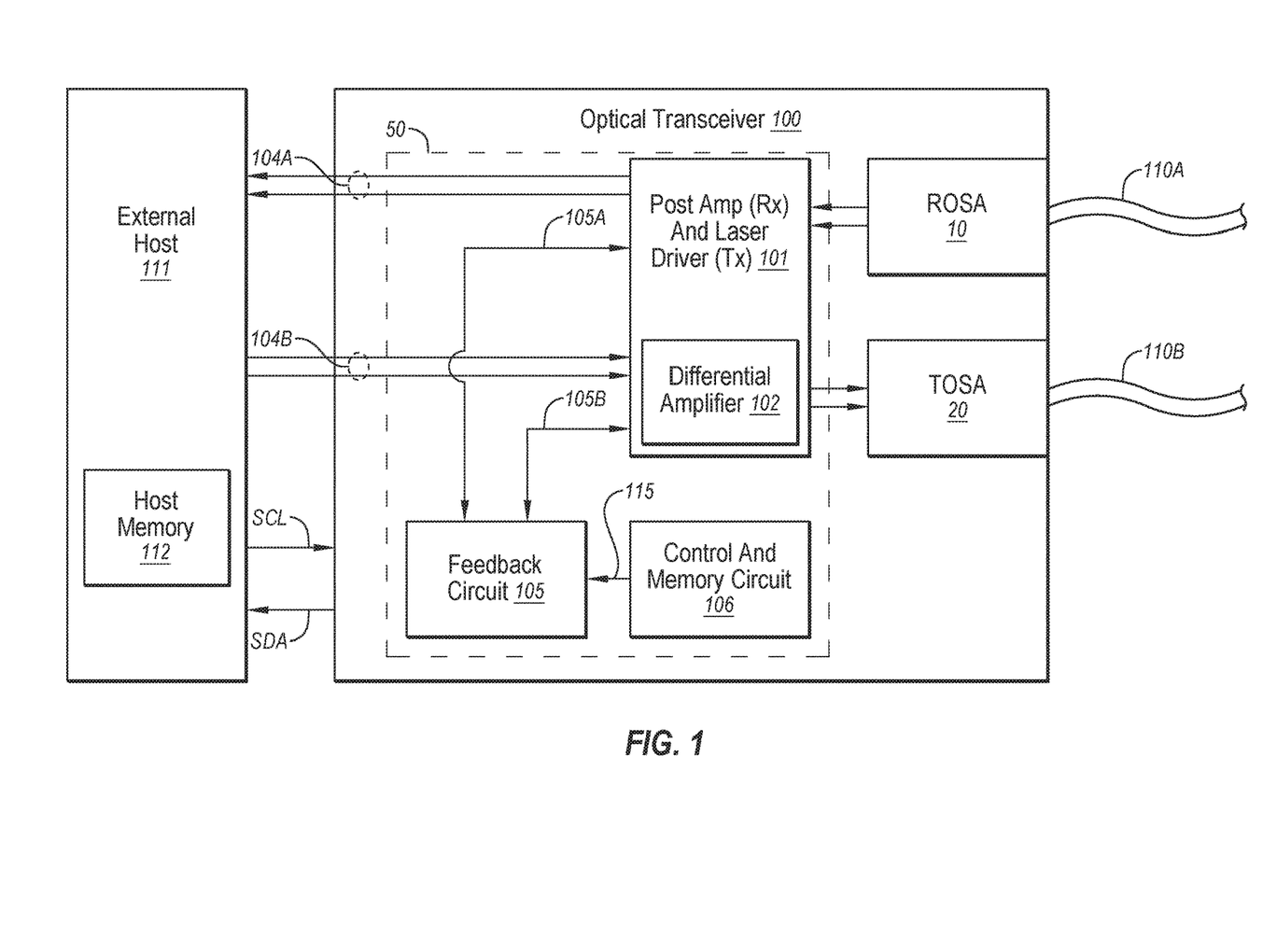
FIG. 1 is a simplified block view showing various aspects of an optical transceiver module including a differential amplifier circuit.

FIG. 1 is a simplified block diagram of an example of an optical transceiver 100 depicting various physical and operational aspects of the transceiver. While the optical transceiver 100 will be described in some detail, the optical transceiver 100 is described by way of illustration only, and not by way of restricting the scope of the invention. The optical transceiver 100 in one embodiment is suitable for optical signal transmission and reception at a variety of per-second data rates, including 1 Gbit/s, 2 Gbit/s, 4 Gbit/s, 8 Gbit/s 10 Gbit/s, as well as even higher data rates. Furthermore, the embodiments described herein may be implemented in optical transceivers conforming with any of a variety of different form factors, examples of which include, but are not limited to, XFP, SFP, SFP+ and SFF, as well as a variety of different communication protocols, examples of which include, but are not limited to, GiGE, SONET, and Fibre Channel.

The optical transceiver 100 includes printed circuit board ("PCB") 50 on which the various electronic components of the transceiver are mounted. One such component is a feedback circuit 105. Feedback circuit 105 is connected to one of a differential amplifier within an integrated post-amplifier/laser driver (PA/LD) 101 by connections such as feedback circuit outputs 105A and feedback circuit inputs 105B. These connections allow feedback circuit 105 to provide a feedback path to a forward path of the differential amplifier 102 and insert a crosspoint offset, as will be described in more detail to follow. Feedback circuit 105 is connected to a control and memory circuit 106, which stores microcode for configuring feedback circuit 105 and is also used to store operational parameters. The feedback circuit 105 is also able to communicate with an external host 111 as depicted by the Serial Data line (SDA) and Serial Clock line (SCL).

While only a single differential amplifier 102 is illustrated, each of the transmit path (e.g., laser driver) and the receive path (e.g., post amplifier) may include separate differential amplifiers coupled to a separate feedback circuit 105. As stated, the optical transceiver 100 includes both a transmit path and a receive path, both of which will now be described. The receive path includes ROSA 10, which transforms an incoming optical data signal into an electrical data signal. The electrical data signal is then provided to a differential amplifier 102. The differential amplifier amplifies and otherwise processes the electrical data signal and provides the electrical data signal to the external host 111 via signal path 104A.

For the transmit path, external host 111 generates an electrical data signal and provides the electrical data signal to a differential amplifier 102 via signal path 104A/B. The differential amplifier 102 processes the electrical data signal and drives the TOSA 20, which causes the TOSA 20 to emit an optical data signal.

The operation of optical transceiver 100 will now be described in further detail. In operation, the optical transceiver 100, receives an optical data signal from a fiber 110A via the ROSA 10 in manner to be described more fully below. The ROSA 10 transforms the received optical data signal into an electrical data signal. The ROSA 10 then provides the resulting electrical data signal to a post-amplifier.

The differential amplifier 102 amplifies the received electrical data signal and provides the amplified data signal to external host 111 over signal path 104A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the host 111 for transmission onto a fiber 110B. Specifically, a differential amplifier 102 of the laser driver portion of the PA/LD 101 receives the electrical data signal from the host 111 via the signal path 104B, and drives a light source within the TOSA 20. One example of a light source is a DML that causes the TOSA 20 to emit onto the fiber 110B optical data signals representative of the information in the electrical data signal provided by the host 111.

The behavior of the ROSA 10, the PA/LD 101, and the TOSA 20 may vary dynamically due to a number of factors. For example, temperature changes, power fluctuations, and feedback conditions may each affect the performance of these components. Accordingly, the optical transceiver 100 includes a feedback circuit 105, which may evaluate environmental conditions, such as temperature, age of the laser, and/or operating conditions, such as voltage, and receive information from the differential amplifier 102 of the post-amplifier portion of the PA/LD 101 by way of feedback circuit outputs 105A, and from the differential amplifier 102 of the laser driver portion of the PA/LD 101 by way of feedback circuit inputs 105B. This arrangement allows the feedback circuit 105 to optimize the performance of the laser to compensate for dynamically varying conditions.

Specifically, the control and memory circuit 106 optimizes the operation of the optical transceiver 100 by adjusting settings in the feedback circuit 105 as represented by control signals 115. These settings adjustments can be intermittent and are generally only made during calibration, recalibration, or deployment of the optical transceiver.

The feedback circuit 105 has access to the control and memory circuit 106. The memory within the control and memory circuit 106 may be used to dynamically or statically store microcode for configuring feedback circuit 105 and for storing operational parameters for the feedback circuit 105.

Data and clock signals may be provided from the host 111 to the optical transceiver 100 using the SDA and SCL lines respectively. Also data may be provided from the optical transceiver 100 to the host 111 to allow for transmitting control and data including operational parameters.

Figure 2:
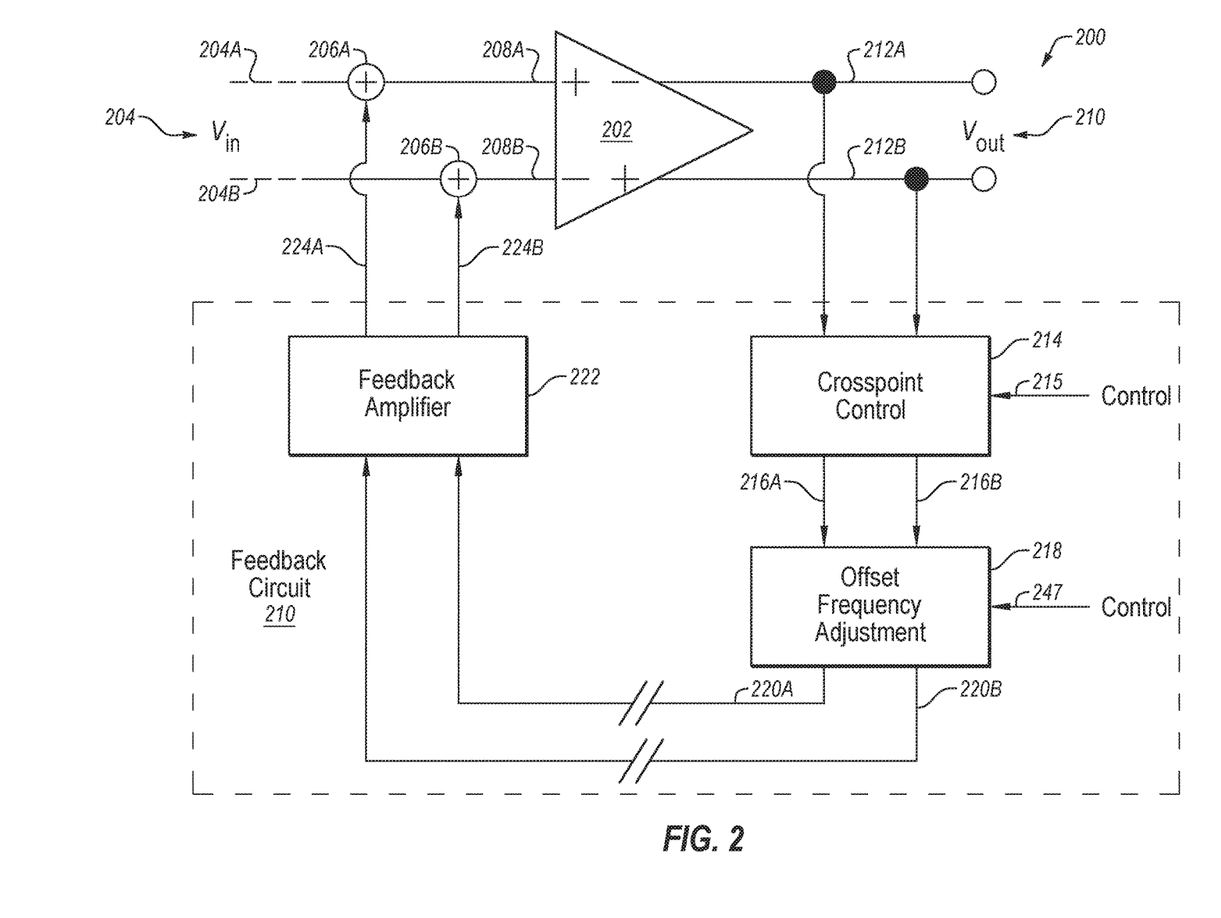
FIG. 2 illustrates a block diagram of a differential amplifier circuit for inserting programmably adjustable crosspoint offset.

FIG. 2 illustrates a block diagram of a differential amplifier circuit for inserting a programmably adjustable crosspoint offset. The differential amplifier circuit 200 may include the differential amplifier 102 and feedback circuit 105, both of FIG. 1. The differential amplifier circuit 200 includes differential input signals ($V_{in}$) 204A/B for conducting signals for transmission by the optical transceiver 100. The differential input signals 204A/B couple to respective summing nodes 206A/B that also receive differential feedback signals 224A/B. The summing nodes 206A/B combine the differential input signals 204A/B with the differential feedback signals 224A/B to form differential feedback-adjusted input signals 208A/B.

The differential amplifier circuit 200 further includes a differential amplifier 202, such as the PA/LD 101 of FIG. 1. The differential amplifier 202 may be configured as a single amplifier stage as illustrated or may be configured as a multi-stage amplifier as discussed below with respect of FIG. 3. The differential amplifier 202 includes inputs for receiving and amplifying the differential feedback signals 208A/B and generating differential output signals ($V_{out}$) 212A/B. The differential output signals 212A/B couple to the TOSA 20 (FIG. 1) which includes a transmission device with an offset that can benefit from an adjustable crosspoint offset generated by the differential amplifier circuit 200.

The differential amplifier circuit 200 further includes a feedback circuit 210, which may correspond to the feedback circuit 105 of FIG. 1. The feedback circuit 210 monitor the operation of the differential amplifier 202 and inserts a crosspoint offset to the differential output signal 212A/B for accommodating transmit circuits that may have an internal offset bias and could better operate as a result of receiving an input signal with a compatible crosspoint offset.

The feedback circuit 210 includes a crosspoint control circuit 214, an offset frequency adjustment circuit 218, and a feedback amplifier 222. The crosspoint control circuit 214 receives the differential output signals 212A/B and generates differential offset signals 216A/B that include a programmably adjustable crosspoint offset. The programmably adjustable crosspoint offset may be controlled by a control signal 215 generated by the control and memory circuit 106 of FIG. 1 which programmably adjusts bias currents (e.g., $I_{adj,1}/I_{adj,2}$) in constant current sources, as further described below.

The offset frequency adjustment circuit 218 receives the differential offset signals 216A/B and generates differential frequency adjusted signals 220A/B. The offset frequency adjustment circuit 218 is configured to remove the DC offset from the differential input signal 204 as DC offset compromises the transceiver performance as data signals may be improperly interpreted based on the DC offset. Accordingly, the offset frequency adjustment circuit 218 may be thought of as a low pass circuit.

The feedback amplifier 222 receives the differential frequency adjusted signal 220A/B and generates the differential feedback signals 224A/B. The feedback amplifier 222 provides the necessary feedback amplification in view of the forward loop amplification of the differential amplifier 202.

Figure 3:
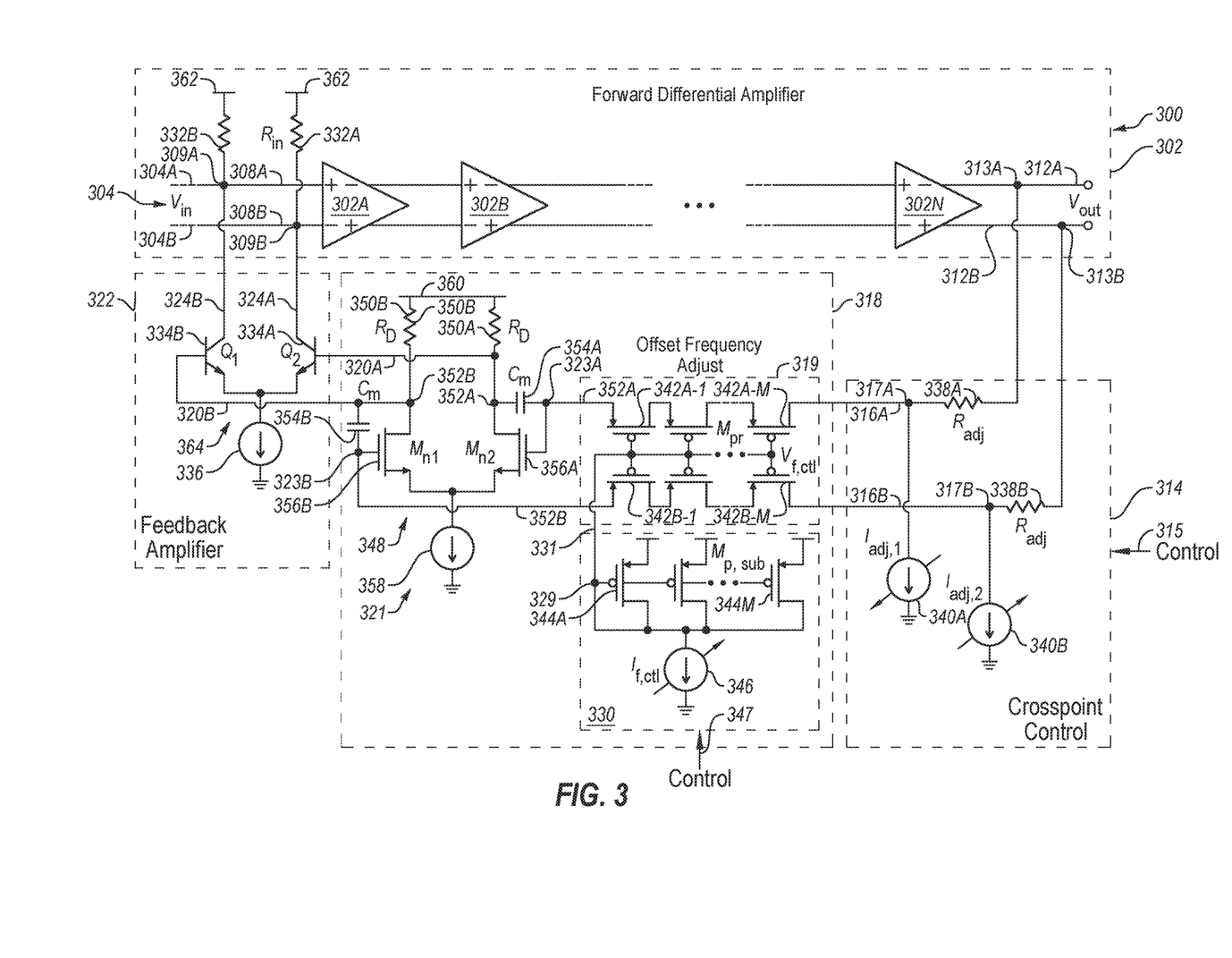
FIG. 3 illustrates a circuit diagram of a differential amplifier circuit for inserting programmably adjustable crosspoint offset.

FIG. 3 illustrates a circuit diagram of a differential amplifier circuit for inserting programmably adjustable crosspoint offset. As stated, certain transmit lasers may display an imbalanced duty cycle causing a crosspoint shift of the optical data eye and compensation for a pre-distorted electrical driving signal with certain offset in the opposite direction may be required. Therefore, a circuit that can simultaneously cancel the unpredictable offset arising from circuit mismatches in the forward amplifier and insert a predictable offset to compensate for internal or external offset is described.

The differential amplifier circuit 300 includes a crosspoint control circuit 314 inserted in the feedback path. The crosspoint control circuit 314 is configured to receive differential output signals 312A/B as inputs at respective nodes 313A/B. The differential output signals 312A/B are also coupled to the output of the differential amplifiers 302, and the differential amplifier may include multiple amplifier stages 302A-302N. The crosspoint control circuit 314 further includes a resistor $R_{adj}$ 338A coupled between the node 313A and a shunt configured programmably adjustable current source 340A. Similarly, the crosspoint control circuit 314 further includes a resistor $R_{adj}$ 338B coupled between the node 313B and a shunt configured programmably adjustable current source 340B.

The crosspoint adjust resistors, $R_{adj}$, may be chosen to have a larger value without multiplying the effect of leakage currents. The larger value of crosspoint adjust resistors, $R_{adj}$, provides reduced power dissipation in the crosspoint control circuit 314 and decouples the parasitic capacitance of the programmably adjustable current sources, $I_{adj,1}$ 340A and $I_{adj,2}$ 340B, to accommodate high speed operation of a forward amplifier in the feedback loop and optimize the linearity of the current mirrors utilized for the programmably adjustable current sources, $I_{adj,1}$ 340A and $I_{adj,2}$ 340B.

The programmably adjustable current sources 340A and 340B are configured to at least partially create a programmably adjustable crosspoint offset voltage difference between nodes 313A and 313B as will be explained in more detail to follow. The programmably adjustable current sources are further configured to receive a control signal 315 from control and memory circuit 106 (FIG. 1) or some other processing source that specifies how much current adjustment is needed by any reasonable electrical interface.

The crosspoint control circuit 314 generates differential offset signals 316A/B as outputs at respective nodes 317A/B. The differential offset signals 316A/B are provided as inputs to an offset frequency adjustment circuit 318. The offset frequency adjustment circuit 318 is substantially configured as a low pass filter (LPF) which includes series resistance followed by parallel capacitance. Specifically, the offset frequency adjustment circuit 318 includes a variable resistance network 319 for generating a variable filter resistance which is controlled by a resistance control circuit 330.

The variable resistance network 319 includes one or more series-configured PMOS transistors 342A for variably resistively passing a first one of the differential offset signals 316A to a capacitance multiplier circuit 321. The variable resistance network 319 further includes one or more series-configured PMOS transistors 342B for passing a second one of the differential offset signals 316B to the capacitance multiplier circuit 321.

Utilization of PMOS devices for implementing filter resistance, $M_{p,r}$, allows selection of a moderate control current, $I_{f,ctl}$, and fewer biasing devices, $M_{p,sub}$, to provide sub-threshold or near cut-off operation of the PMOS devices $M_{p,r}$ for increasing (maximizing) resistance. Such an outcome results from the common mode voltage of $V_{out}$ being lower (i.e., by hundreds of millivolts) than the supply voltage.

A control output at node 329 of the resistance control circuit 330 provides a variable resistance network control signal 331 that couples to the gates of the PMOS transistors 342A/B of the variable resistance network 319. The variable resistance network control signal 331 generated by one or more parallel configured PMOS transistors 344 are controlled by and commonly coupled to programmable current source 346. The programmable current source 346 is further configured to receive a control signal 347 from the control and memory circuit 106 (FIG. 1) or some other processing source that specifies the needed amount of current adjustment $I_{f,ctl}$. The resistance control circuit 330 may be configured to compensate for deviations in process, voltage, and temperature (PVT) during operation of the differential amplifier circuit 300.

The variable resistance network 319 couples to the capacitance multiplier circuit 321. The capacitance multiplier circuit 321 provides the apparent capacitance for the low pass filter operation of the offset frequency adjustment circuit 318. The capacitance multiplier circuit 321 is configured to enable a smaller sized passive capacitor $C_m$ to project a larger capacitance value without requiring the larger footprint area as would be required by an actual larger passive capacitor.

The capacitance multiplier circuit 321 receives the differential attenuated signals 325A/B at respective nodes 323A/B. The capacitance multiplier circuit 321 includes a first capacitor Cm 354A and a second capacitor Cm 354B coupled at respective nodes 352A and 352B in a Miller configuration with parallel-configured transistor $M_{n1}$ 356A and transistor $M_{n2}$ 356B. The nodes 352A and 352B are further coupled to the respective drains of transistor $M_{n1}$ 356A and transistor $M_{n2}$ 356B and to respective pull-up resistor $R_D$ 350A and resistor $R_D$ 350B and pull-up voltage 360.

The offset frequency adjustment circuit 318 generates differential frequency adjusted signals 320A/B on nodes 352A/B. The differential frequency adjusted signals 320A/B couple to the feedback amplifier 322. The feedback amplifier 322 provides amplification in the feedback loop at least partially corresponding to amplification in the forward loop. The feedback amplifier 322 includes a first bipolar transistors Q1 324A and a second bipolar transistor Q2 324B coupled in parallel. The transistors 324A/B are coupled at their emitters to a constant current source 336. The collectors of transistors 324A/B are coupled to respective nodes 309A and 309B are further coupled to respective pull-up resistor $R_{EN}$ 332A and resistor $R_{IN}$ 332B.

The differential input signals 304A/B may then be summed at respective nodes 309A/B with the amplifier output signals 324A/B. The differential summed signal 308A/B is then input to the forward differential amplifiers 302.

Figure 4:
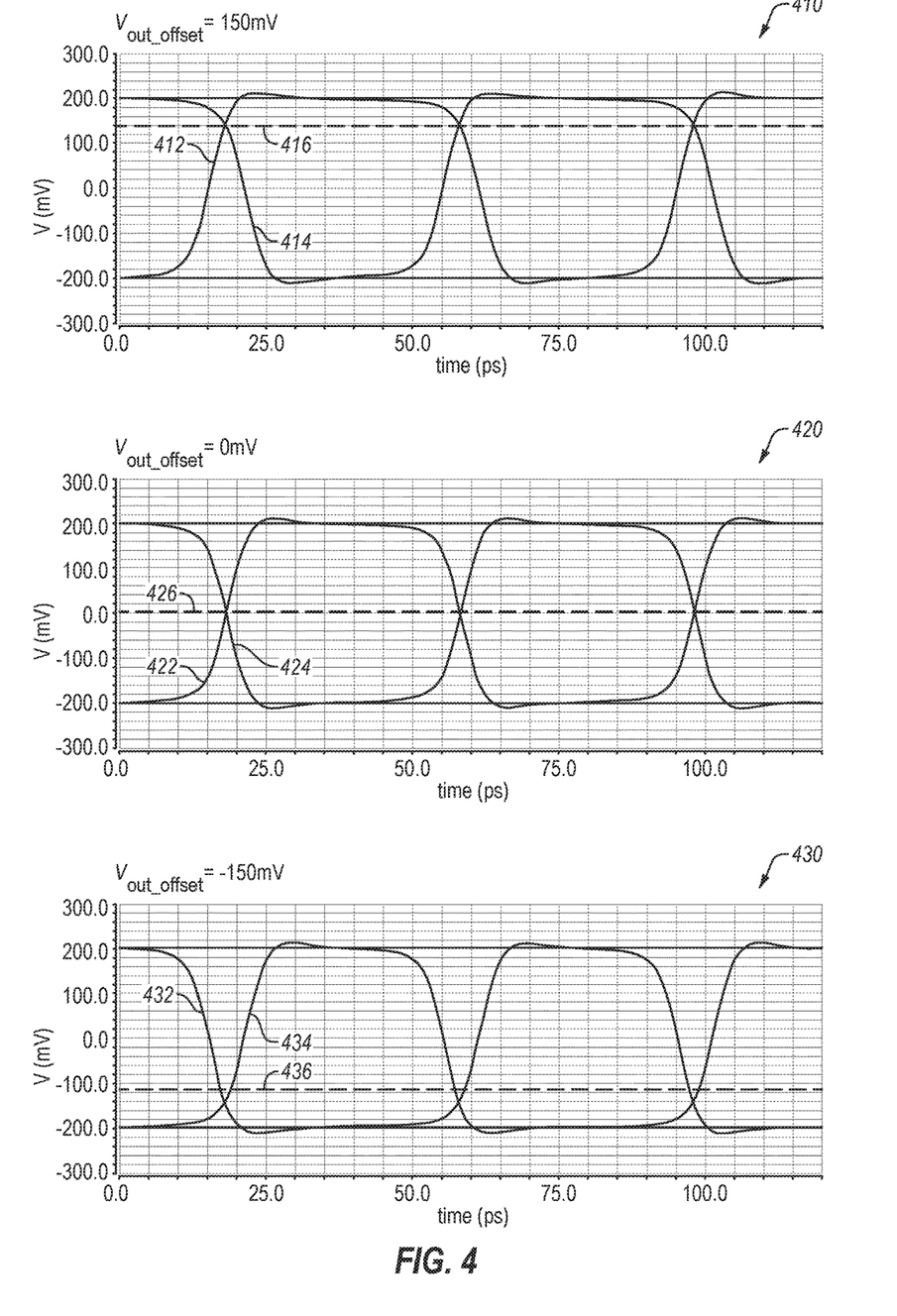
FIG. 4 illustrates plots of various differential output signals including various programmably adjustable crosspoint offsets.

FIG. 4 illustrates plots of various differential output signals including various programmably adjustable crosspoint offsets. The x-axis of plots 410, 420, and 430 are plots of the output voltage V as affected by various offset voltage $V_{out\_offset}$. Plot 410 illustrates a programmably adjustable crosspoint offset voltage 416 that has been adjusted to, for example, a positive programmably adjustable crosspoint offset voltage. By way of example, plot 410 illustrates an adjustment to the programmably adjustable crosspoint offset voltage $V_{out\_offset}$ equal to +150 mV. The adjustment in the programmably adjustable crosspoint offset voltage results in an eye plot of the differential Vout signals 412/414 exhibiting signal crossings at a positive value.

Plot 420 illustrates a programmably adjustable crosspoint offset voltage 426 that has been adjusted to, for example, a zero programmably adjustable crosspoint offset voltage. By way of example, plot 420 illustrates an adjustment to the programmably adjustable crosspoint offset voltage $V_{out\_offset}$ equal to 0 mV. The adjustment in the programmably adjustable crosspoint offset voltage results in an eye plot of the differential Vout signals 422/424 exhibiting signal crossings at a zero value.

Plot 430 illustrates a programmably adjustable crosspoint offset voltage 436 that has been adjusted to, for example, a negative programmably adjustable crosspoint offset voltage. By way of example, plot 430 illustrates an adjustment to the crosspoint offset voltage $V_{out\_offset}$ equal to −150 mV. The adjustment in the crosspoint offset voltage results in an eye plot of the differential Vout signals 432/434 exhibiting signal crossings at a negative value.

Figure 5:
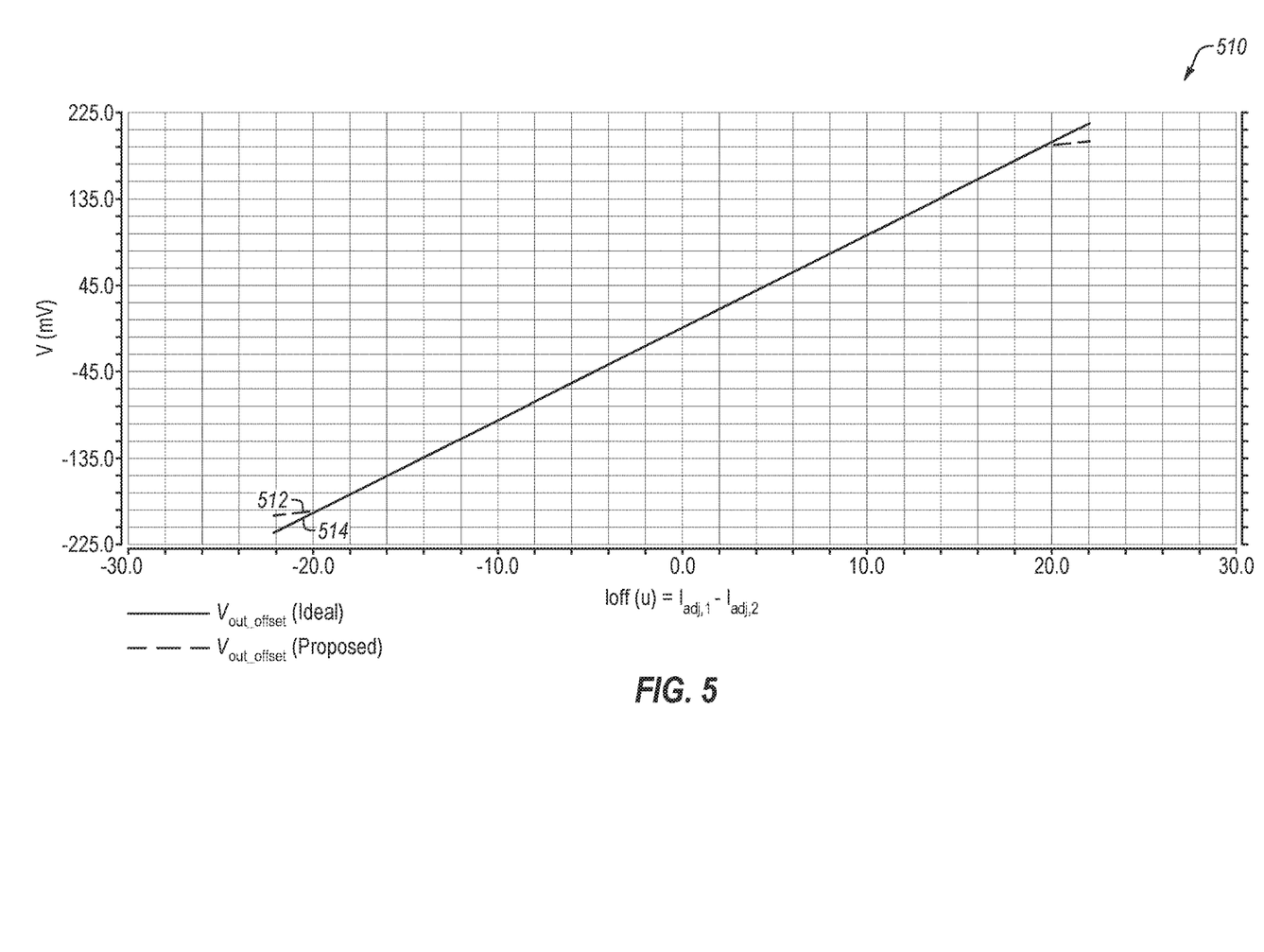
FIG. 5 illustrates a graph of plots of ideal and inserted offsets compared with respect to the offset control current.

FIG. 5 illustrates a graph of plots of ideal and inserted offsets compared with respect to the offset control current. The y-axis is a plot of the offset control voltage $V_{out\_offset}$. The x-axis is a plot of the offset current which is the difference between the currents flowing through the adjustable current sources 340A/340B of FIG. 3. The plot 514 illustrates an ideal linear relationship between the current sources 340A and 340B and the offset voltage. The plot 512 illustrates an actual linear relationship between difference between the current sources 340A and 340B and the resulting offset voltage.

Figure 6:
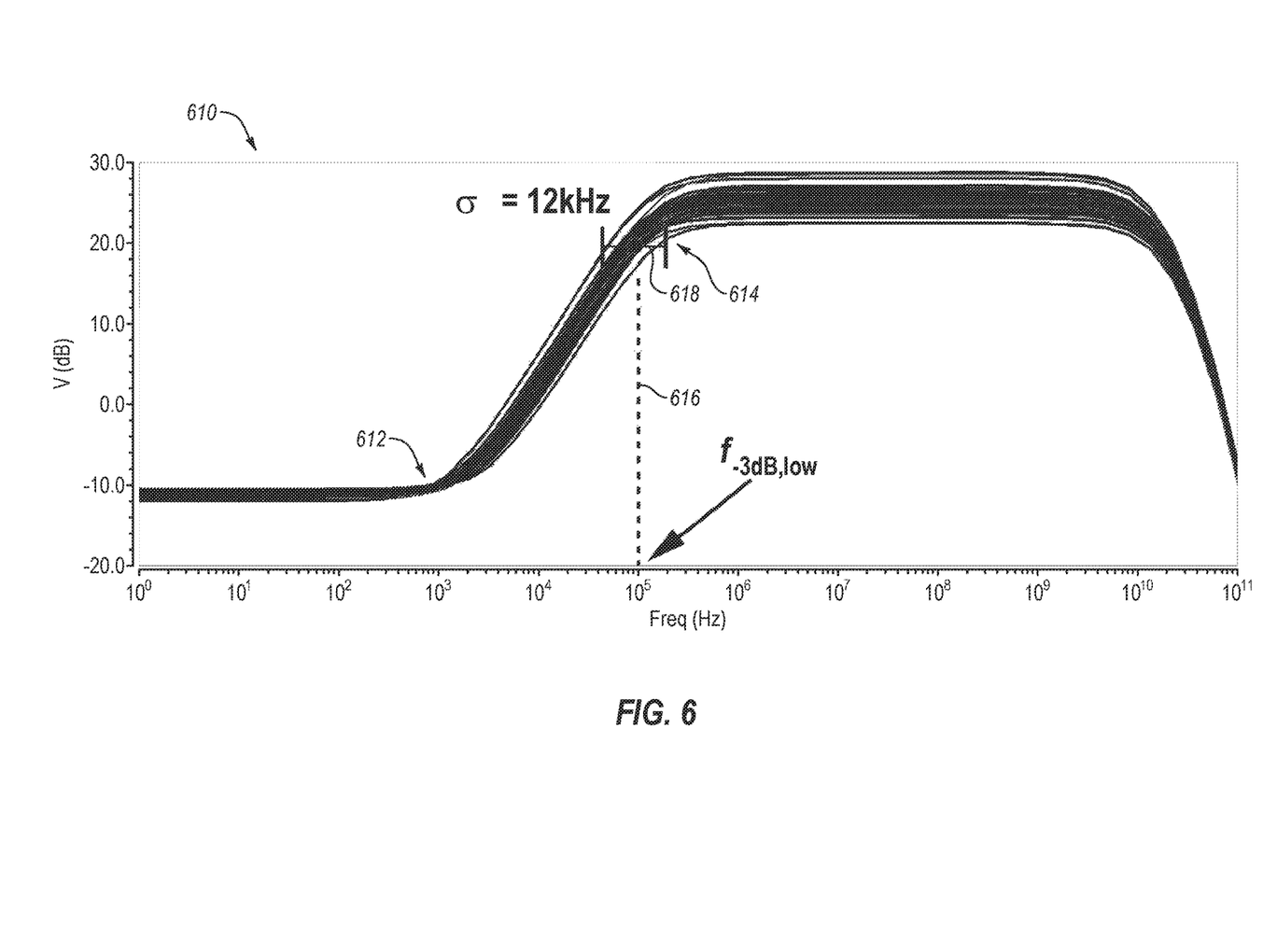
FIG. 6 illustrates a graph of plots of the frequency response of the forward amplifier with various programmably adjusted crosspoint offsets.

FIG. 6 illustrates a graph of plots of the frequency response of the forward amplifier with various programmably adjusted crosspoint offsets. The forward loop amplifiers 302 exhibit a frequency response of a high pass filter, as illustrated in FIG. 6. Inflection point 612 illustrates a lower cut-off frequency. The gain of the loop is indicated by the slope of the plots after the inflection point 612 and before an inflection point 614. A band 618 illustrates acceptable variations to the gain with respective differences in crosspoint offset voltages. The variations due to different crosspoint offset voltages still yields a substantially linear output voltages.

Figure 7A:
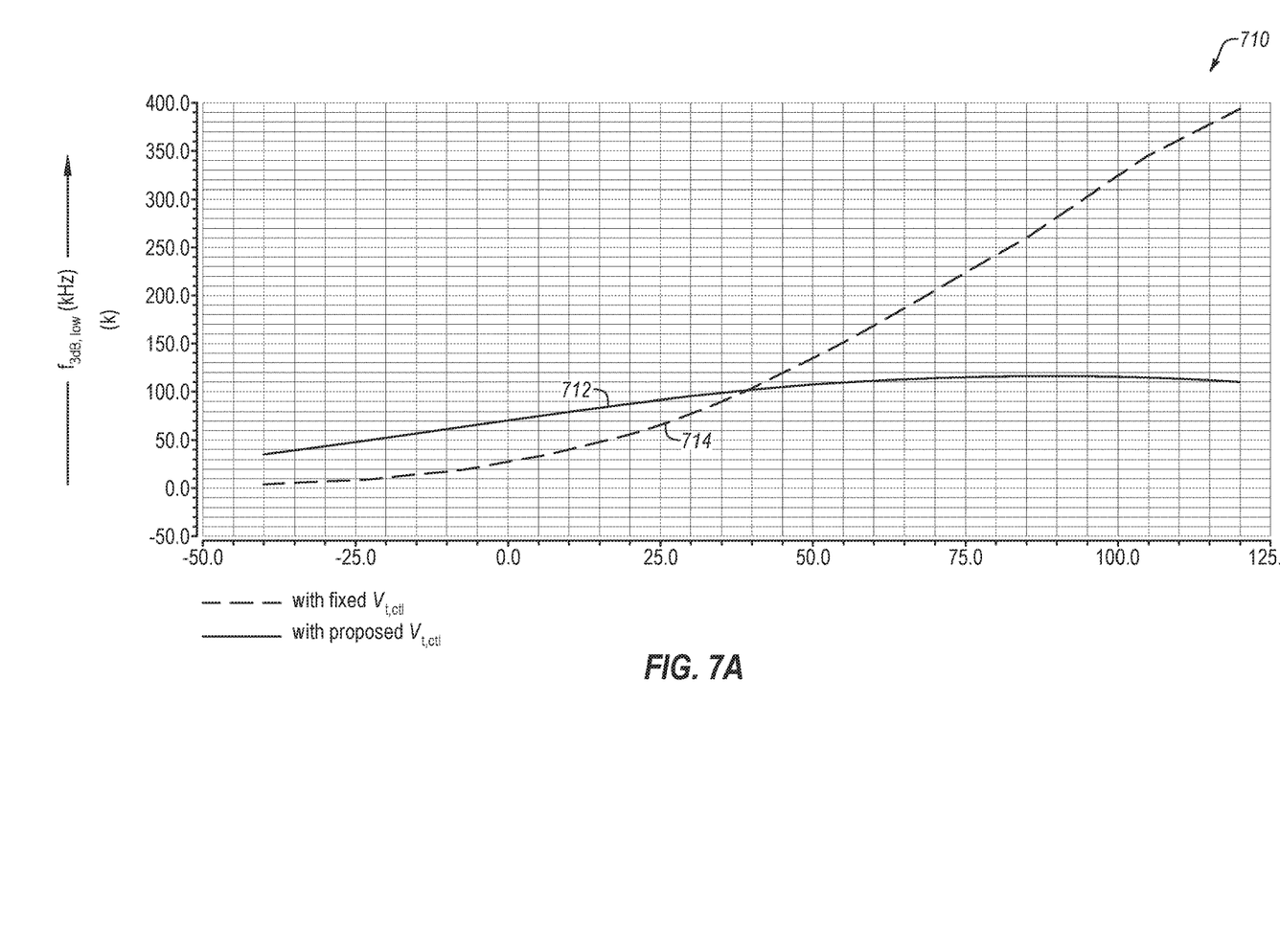
FIG. 7A and FIG. 7B illustrate graphs of plots of the frequency response of the circuit of FIG. 3 with a fixed control value compared to an adapting control values as a function of temperature variations and as a function of process variations.
Figure 7B:
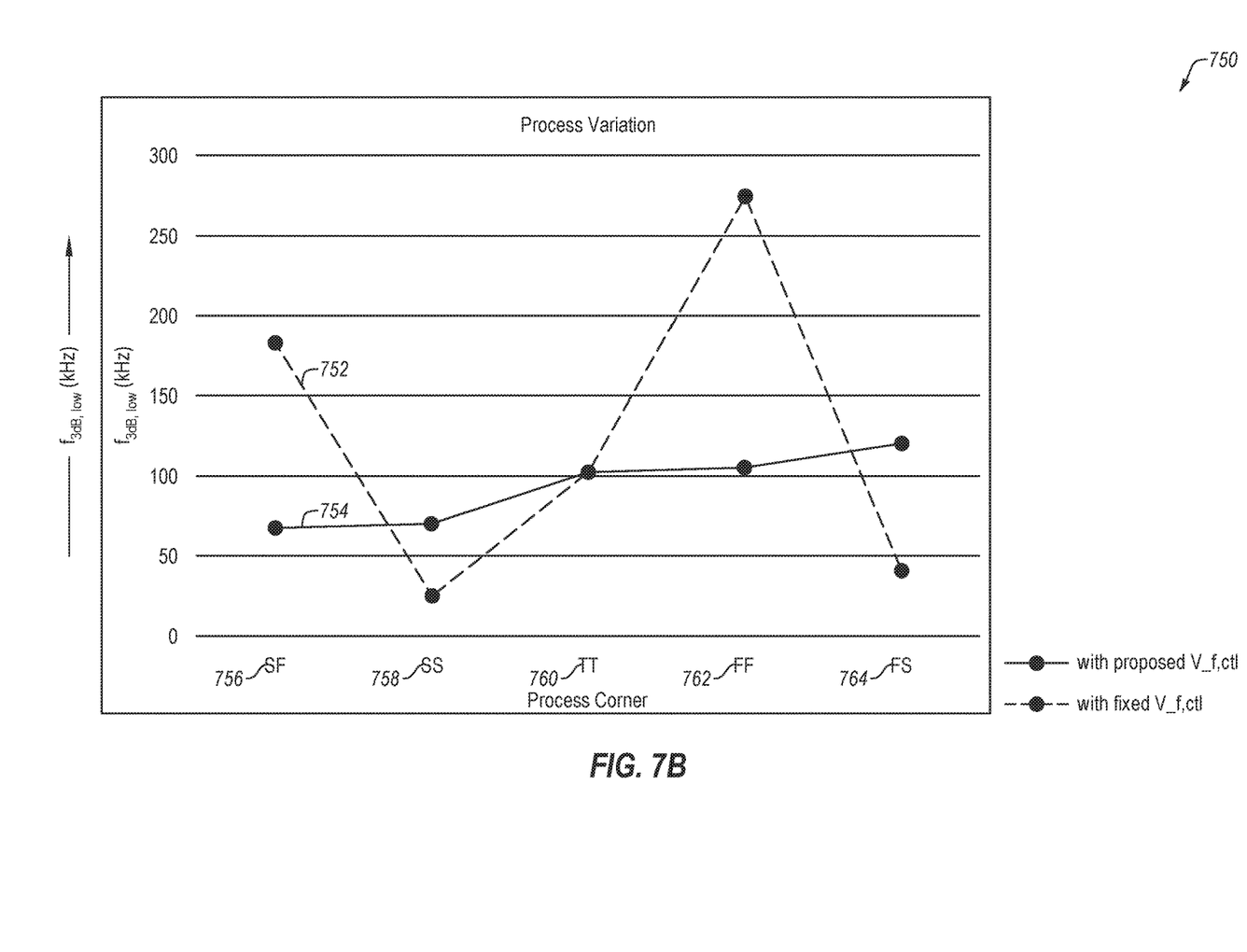

FIG. 7A and FIG. 7B illustrate graphs of plots of the frequency response of the circuit of FIG. 3 with a fixed control value compared to an adapting control values as a function of temperature variations and as a function of process variations. Plot 714 illustrates the frequency response over temperature if a fixed control voltage Vf,ctl is used to control the variable resistive network 319 of the offset frequency adjustment circuit 318 of FIG. 3. As illustrated, a fixed control voltage Vf,ctl as illustrated in plot 714 illustrates severe frequency deviation over temperature.

In contrast, when a variable control circuit, such as resistance control circuit 330 of FIG. 3 is used to generate control voltage Vf,ctl, then the variation of the 3 dB inflection point 614 of FIG. 6, remains essentially constant over temperature variations, as illustrated by plot 712 in FIG. 7A.

A graph 750 illustrates plots of frequency variations as a function of process corners. Plot 752 illustrates the frequency response over process corners if a fixed control voltage Vf,ctl is used to control the variable resistive network 319 of the offset frequency adjustment circuit 318 of FIG. 3. As illustrated, a fixed control voltage Vf,ctl as illustrated in plot 714 illustrates severe frequency deviation over process corners.

In contrast, when a variable control circuit, such as resistance control circuit 330 of FIG. 3 is used to generate control voltage Vf,ctl, then the variation of the 3 dB inflection point 614 of FIG. 6, remains essentially constant over process corner variations, as illustrated by plot 754 in FIG. 7B.

Figure 8:
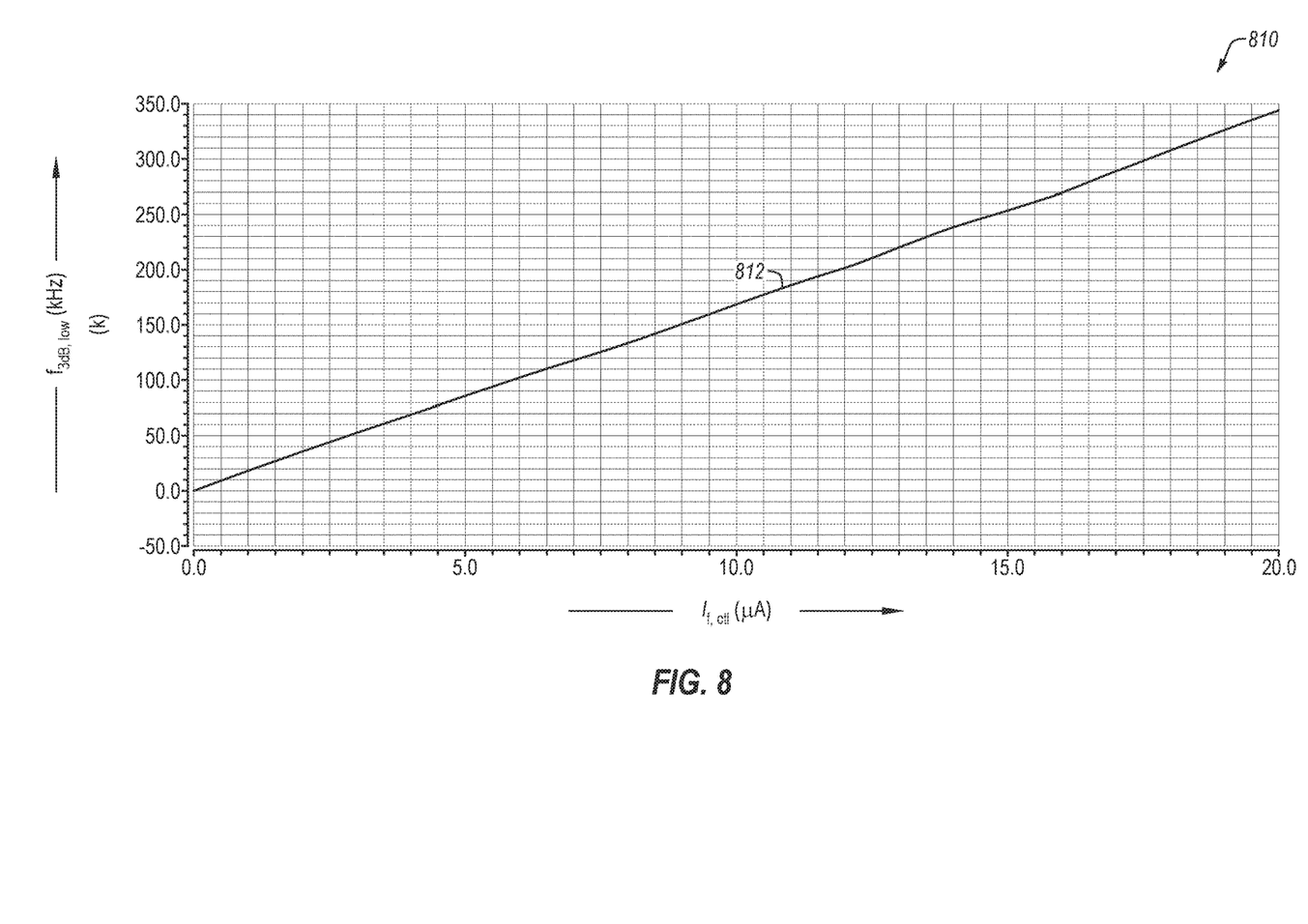
FIG. 8 illustrates a graph of a plot of the control of the lower cutoff frequency when the control current through the variable current source of FIG. 3 is adjusted.

FIG. 8 illustrates a graph of a plot of the control of the lower cutoff frequency when the control current through the variable current source of FIG. 3 is adjusted. Adjusting the current $I_{f,ctl}$ results in a substantially linear response as illustrated by plot 812.

Figure 9:
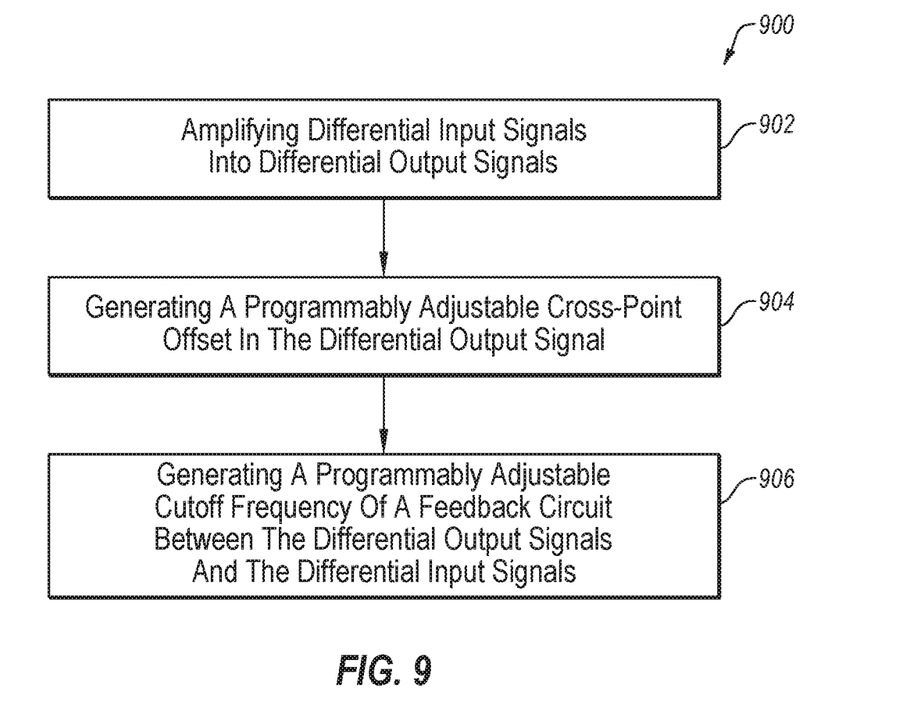
FIG. 9 illustrates a flowchart of a method for generating a programmably adjustable crosspoint offset in a differential output signal.

FIG. 9 illustrates a flowchart of a method for generating a programmably adjustable crosspoint offset in a differential output signal. The method 900 may be implemented in some embodiments to provide an area-efficient DC offset cancellation and accurate crosspoint control in differential amplifiers. Specifically, the differential circuit method may cancel random statistical offset and insert a controlled programmable adjustable crosspoint offset into the differential output signal which may provide benefit to subsequent circuit elements that may exhibit a particular crosspoint bias that may be accommodated by the amplifier circuit and method described herein with respect to FIGS. 1-9.

As shown in block 902, the method may include amplifying differential input signals into differential output signals. As described above, the amplification may occur in one or more amplifier stages.

As shown in block 904, the method may further include generating a programmably adjustable crosspoint offset in the differential output signal. As stated, a programmable adjustable crosspoint offset inserted into the differential output signal may provide benefit to subsequent circuit elements (e.g., laser driver) that may exhibit a particular crosspoint bias (positive or negative) that may be accommodated by the amplifier circuit and method described herein As shown in block 906, the method may yet further include generating a programmably adjustable cutoff frequency in a feedback circuit located between the differential output signals and the differential input signals. The cutoff frequency in the feedback circuit defines a cutoff frequency for the low pass filter configuration of the feedback circuit. This low pass frequency cutoff frequency also defines the inflection point for the forward loop that appears as a high pass filter.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An amplifier circuit, comprising:
a differential amplifier circuit configured to amplify differential input signals into differential output signals; and
a feedback circuit coupled between the differential output signals and the differential input signals and configured to generate a programmably adjustable crosspoint offset in the differential output signals and a programmably adjustable cutoff frequency of the feedback circuit, wherein the feedback circuit includes an offset frequency adjustment circuit configured to adjust the programmably adjustable cutoff frequency, and the offset frequency adjustment circuit includes a resistance control circuit configured to control active devices generating a variable filter resistance.

2. The amplifier circuit of claim 1, wherein the feedback circuit comprises a crosspoint control circuit including programmably adjustable current sources to cooperatively generate the programmably adjustable crosspoint offset in the differential output signals.

3. The amplifier circuit of claim 1, wherein the offset frequency adjustment circuit configured as a low pass filter.

4. The amplifier circuit of claim 3, wherein the offset frequency adjustment circuit includes a variable resistance network configured to generate the variable filter resistance for the low pass filter.

5. The amplifier circuit of claim 4, wherein the variable resistance network comprises the active devices to generate the variable filter resistance.

6. The amplifier circuit of claim 1, wherein the resistance control circuit is configured to compensate for process-voltage-temperature (PVT) variations in the active devices generating the variable filter resistance.

7. An amplifier circuit comprising:
a differential amplifier circuit configured to amplify differential input signals into differential output signals; and
a feedback circuit coupled between the differential output signals and the differential input signals and configured to generate a programmably adjustable crosspoint offset in the differential output signals and a programmably adjustable cutoff frequency of the feedback circuit, wherein the feedback circuit comprises an offset frequency adjustment circuit configured to adjust the programmably adjustable cutoff frequency, wherein the offset frequency adjustment circuit includes at least one capacitor for each of the differential output signals each coupled a capacitance multiplier circuit to generate filter capacitance for the low pass filter.

8. An amplifier method, comprising:
amplifying differential input signals into differential output signals;
generating a programmably adjustable crosspoint offset in the differential output signals;
generating a programmably adjustable cutoff frequency of a feedback circuit between the differential output signals and the differential input signals, including adjusting the programmably adjustable cutoff frequency of the feedback circuit as a low pass filter; and
generating a filter resistance for the low pass filter based in part on a variable resistance in the feedback circuit, the variable resistance controlled by a resistance control circuit.

9. The amplifier method of claim 8, wherein the generating the programmably adjustable crosspoint offset comprises generating the programmably adjustable crosspoint offset in the differential output signals by controlling programmably adjustable current sources in the feedback circuit.

10. The amplifier method of claim 8, wherein the filter resistance for the low pass filter is generated based in part on a variable resistance network for generating the variable resistance in the feedback circuit.

11. The amplifier method of claim 10, wherein the variable resistance network comprises active devices for generating the variable resistance.

12. The amplifier method of claim 11, wherein the variable resistance is generated by controlling the active devices from the resistance control circuit.

13. The amplifier method of claim 8, wherein the variable resistance is further generated by compensating for process-voltage-temperature (PVT) variations in the active devices.

14. An amplifier method comprising:
amplifying differential input signals into differential output signals;
generating a programmably adjustable crosspoint offset in the differential output signals;
generating a programmably adjustable cutoff frequency of a feedback circuit between the differential output signals and the differential input signals; and
generating filter capacitance for a low pass filter using a capacitance multiplier circuit.

15. An amplifier circuit, comprising:
a differential amplifier circuit including differential inputs to couple to differential input signals and differential outputs to couple to differential output signals; and
a feedback circuit coupled between the differential outputs and the differential inputs, the feedback circuit including:
a crosspoint control circuit coupled to the differential outputs and including programmably adjustable current sources to cooperatively generate a programmably adjustable crosspoint offset in the differential output signals;
an offset frequency adjustment circuit coupled to the crosspoint control circuit; and
a feedback amplifier circuit coupled to the offset frequency adjustment circuit and the differential inputs.

16. The amplifier circuit of claim 15, wherein the offset frequency adjustment circuit includes a variable resistance network configured to generate a programmably adjustable cutoff frequency of the feedback circuit.

17. The amplifier circuit of claim 16, wherein the offset frequency adjustment circuit further includes a resistance control circuit to control the variable resistance network and compensate for process-voltage-temperature (PVT) variations in the variable resistance network.

18. The amplifier circuit of claim 16, wherein the feedback circuit includes at least one capacitor to at least indirectly couple with each of the differential output signals, each of the at least one capacitor coupled to a capacitance multiplier circuit to generate filter capacitance to determine the programmably adjustable cutoff frequency of the feedback circuit.

* * * * *